(12) United States Patent
Nishiyama et al.

(10) Patent No.: US 7,569,972 B2
(45) Date of Patent: Aug. 4, 2009

(54) SURFACE ACOUSTIC WAVE DEVICE

(75) Inventors: Kenji Nishiyama, Yasu (JP); Takeshi Nakao, Omihachiman (JP); Michio Kadota, Kyoto (JP)

(73) Assignee: Murata Manufacturing Co., Ltd., Kyoto (JP)

(*) Notice: Subject to any disclaimer, the term of this patent is extended or adjusted under 35 U.S.C. 154(b) by 0 days.

(21) Appl. No.: 12/234,836

(22) Filed: Sep. 22, 2008

(65) Prior Publication Data

US 2009/0009028 A1 Jan. 8, 2009

Related U.S. Application Data

(63) Continuation of application No. PCT/JP2007/057558, filed on Apr. 4, 2007.

(30) Foreign Application Priority Data

Apr. 24, 2006 (JP) .............................. 2006-118949

(51) Int. Cl.
*H01L 41/08* (2006.01)
(52) U.S. Cl. ................ 310/313 A; 310/313 R
(58) Field of Classification Search ............. 310/313 A, 310/313 R
See application file for complete search history.

(56) References Cited

U.S. PATENT DOCUMENTS 4,562,371 A * 12/1985 Asai et al. ................ 310/313 A
5,757,250 A * 5/1998 Ichikawa et al. ............ 333/193
5,923,231 A * 7/1999 Ohkubo et al. .............. 333/193
6,580,198 B2 * 6/2003 Nakano et al. .......... 310/313 R
7,224,101 B2 * 5/2007 Mishima et al. ......... 310/313 A
7,471,171 B2 * 12/2008 Miura et al. ................. 333/193
2007/0096592 A1 * 5/2007 Kadota et al. ........... 310/313 A

FOREIGN PATENT DOCUMENTS

JP 2005-354430 A 12/2005

OTHER PUBLICATIONS

Kenji Nishiyama et al.: "Surface Acoustic Wave Device," U.S Appl. No. 12/243,010, filed Oct. 1, 2008.
Official Communication issued in International Patent Application No. PCT/JP2007/057558, mailed on Jul. 17, 2007.

* cited by examiner

*Primary Examiner*—Mark Budd
(74) *Attorney, Agent, or Firm*—Keating & Bennett, LLP (57) ABSTRACT

A surface acoustic wave device utilizing a Rayleigh wave includes a $LiNbO_3$ substrate having Euler angles of ($0°\pm5°$, $\theta\pm5°$, $0°\pm10°$), an electrode which is disposed on the $LiNbO_3$ substrate and which includes an IDT electrode primarily including Au, a first silicon oxide film disposed in a region other than the region in which the above-described electrode is disposed, the first silicon oxide film having a film thickness substantially equal to the thickness of the above-described electrode, and a second silicon oxide film arranged to cover the electrode and the first silicon oxide film, wherein the film thickness of the electrode is in the range of about $0.062\lambda$ to about $0.14\lambda$, where $\lambda$ represents the wavelength of a surface acoustic wave, and $\theta$ of the above-described Euler angles of ($0°\pm5°$, $\theta\pm5°$, $0°\pm10°$) is in the range satisfying the following Formula (1):

$$\theta=31.72-206.92\times\exp(-1\times T_{Au}/0.0138) \quad \text{Formula (1)}$$

where $T_{Au}$ is a value of Au electrode film thickness normalized with the wavelength $\lambda$.

3 Claims, 6 Drawing Sheets

SURFACE ACOUSTIC WAVE DEVICE

BACKGROUND OF THE INVENTION

1. Field of the Invention

The present invention relates to a surface acoustic wave device used as, for example, a resonator and a band pass filter. In particular, the present invention relates to a surface acoustic wave device that includes an IDT electrode and a silicon oxide film disposed on a LiNbO₃ substrate and that utilizes Rayleigh wave.

2. Description of the Related Art

Band pass filters used for RF stages of cellular phones and other devices are required to be broadband and have good temperature characteristics. Therefore, a surface acoustic wave device in which an IDT electrode is disposed on a piezoelectric substrate made of a rotated Y-cut x-propagation LiTaO₃ substrate or a rotated Y-cut x-propagation LiNbO₃ substrate and a silicon oxide film is arranged to cover the IDT electrode has been used. With this type of piezoelectric substrate, the temperature coefficient of resonant frequency has a negative value. Therefore, to improve the temperature characteristics, the silicon oxide film having a positive temperature characteristic of resonant frequency is arranged to cover the IDT electrode.

However, with this structure, when the IDT electrode is made of general-purpose Al or an alloy primarily including Al, a satisfactory reflection coefficient of the IDT electrode cannot be obtained. Consequently, there is a problem in that a ripple is likely to occur in the resonant characteristic.

In order to solve the above-described problems, WO 2005-034347 discloses a surface acoustic wave device in which an IDT electrode primarily made of a metal having a density greater than that of Al is disposed on a piezoelectric substrate made of LiNbO₃ having an electromechanical coefficient $K^2$ of at least about 0.025, a first silicon oxide film having a film thickness substantially equal to the thickness of the electrode is disposed in a region other than the region in which the IDT electrode is disposed, and a second silicon oxide film is laminated so as to cover the electrode and the first silicon oxide film.

In the surface acoustic wave device described in WO 2005-034347, the density of the above-described IDT electrode is specified to be at least about 1.5 times greater than the density of the first silicon oxide film, and the reflection coefficient of the IDT electrode is thereby satisfactorily increased and a ripple which occurs in the resonant characteristic can be suppressed.

In WO 2005-034347, a Rayleigh wave is used, Au, Cu, and other suitable metals are disclosed as the material for the electrode, a configuration in which, when the electrode is made of Au, the film thickness thereof is specified to be about 0.0017λ to about 0.06λ is disclosed, and in particular, it is disclosed that if the film thickness is specified to be about 0.0017λ to about 0.03λ, the electromechanical coefficient $K^2$ of the Rayleigh wave can be increased.

Furthermore, a LiNbO₃ substrate represented by Euler angles of (0°±5°, 38°±10°, 0°) is disclosed, and a configuration in which the film thickness of the above-described second silicon oxide film is specified to be in the range of about 0.15λ to about 0.4λ is disclosed, where the wavelength of the surface acoustic wave is denoted as λ.

In recent years, the frequencies at which the surface acoustic wave devices must be able to function have increased. Consequently, the pitch of electrode fingers of the IDT electrode has been reduced and the width dimension of the electrode finger itself has also been reduced. As a result, the wiring resistance increases and the loss in the surface acoustic wave device is likely to increase.

An increase in film thickness of the electrode is sufficient to reduce the loss in the surface acoustic wave device. However, as described in, for example, WO 2005-034347, the film thickness of the IDT electrode made of Au is specified to be a maximum of about 0.06λ. The reason for this is believed to be that if the film thickness of the IDT electrode made of Au is greater than about 0.06λ, the response of the SH wave sharply increases, and a large spurious response appears between the resonant frequency and the anti-resonant frequency. Therefore, in WO 2005-034347, when the IDT electrode is made of Au, the thickness thereof is specified to be in the range of about 0.0017λ to about 0.06λ, and preferably, in the range of about 0.0017λ to about 0.03λ.

Consequently, where greater frequencies are used, the pitch of electrode fingers is reduced, and the width dimension of electrode finger is reduced, the film thickness of the electrode cannot be sufficiently increased. Therefore, the wiring resistance increases and the loss are likely to increase.

Furthermore, as described above, the temperature characteristic of resonant frequency is improved by providing the silicon oxide film. However, there is a problem in that the characteristic is varied because of variations in film thickness of the silicon oxide film.

SUMMARY OF THE INVENTION

To overcome the problems described above, preferred embodiments of the present invention provide a surface acoustic wave device utilizing a Rayleigh wave, wherein an increase in the loss does not significantly occur even when the pitch of electrode fingers is reduced and the width dimension of electrode finger is reduced so as to be suitable for use in higher frequencies.

According to a preferred embodiment of the present invention, a surface acoustic wave device utilizing Rayleigh waves is provided, the device includes a LiNbO₃ substrate represented by Euler angles of (0°±5°, 0±5°, 0°±10°), an electrode disposed on the LiNbO₃ substrate and including an IDT electrode primarily including Au, a first silicon oxide film disposed in a region other than the region in which the electrode is disposed, the first silicon oxide film having a film thickness substantially equal to the thickness of the electrode, and a second silicon oxide film arranged to cover the electrode and the first silicon oxide film, wherein the film thickness of the electrode is in the range of about 0.062λ to about 0.14λ, where λ represents the wavelength of a surface acoustic wave, and θ of the Euler angles of (0°±5°, 0±5°, 0°±10°) is in the range satisfying the following Formula (1).

$$\theta = 31.72 - 206.92 \times \exp(-1 \times T_{Au}/0.0138) \quad \text{Formula (1)}$$

where $T_{Au}$ is a value of a Au electrode film thickness normalized with the wavelength λ.

Preferably, the film thickness H of the second silicon oxide film is the range of about 0.15λ to about 0.50λ, for example, and the electromechanical coefficient $K^2$ of the Rayleigh wave is at least about 6%, so as to facilitate broadening of the band.

Preferably, the electrode including an IDT electrode primarily including Au is disposed on the LiNbO₃ substrate and the first and the second silicon oxide films are disposed on the electrode and the LiNoO₃ substrate, and the film thickness of the electrode is in the above-described specific range. Therefore, the electric resistance can be reduced and, thereby, the loss can be reduced even when higher frequencies are used. In addition, since θ of the Euler angle of the LiNbO₃ substrate is in the above-described specific range, the electromechanical coefficient of the Rayleigh wave is not significantly reduced.

Consequently, according to preferred embodiments of the present invention, a broadband surface acoustic wave device which can be easily adapted to higher frequencies and which has a reduced loss can be provided.

Other features, elements, steps, characteristics and advantages of the present invention will become more apparent from the following detailed description of preferred embodiments of the present invention with reference to the attached drawings.

DETAILED DESCRIPTION OF PREFERRED EMBODIMENTS

Preferred embodiments of the present invention will be described with reference to the drawings.

Figure 1A:
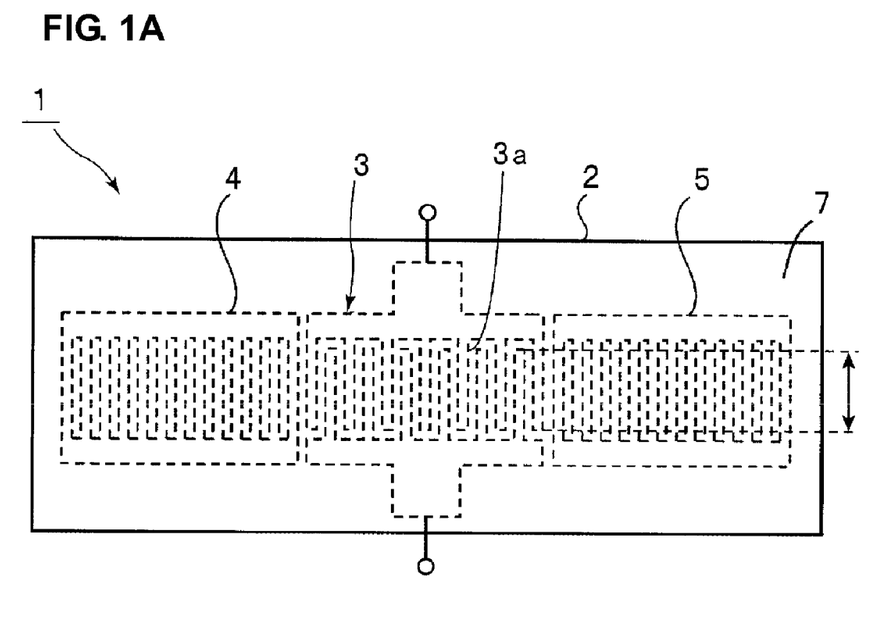
FIGS. 1A and 1B are a schematic plan view of a surface acoustic wave device according to a preferred embodiment of the present invention and a magnified partial cutaway front sectional view showing a portion thereof.
Figure 1B:
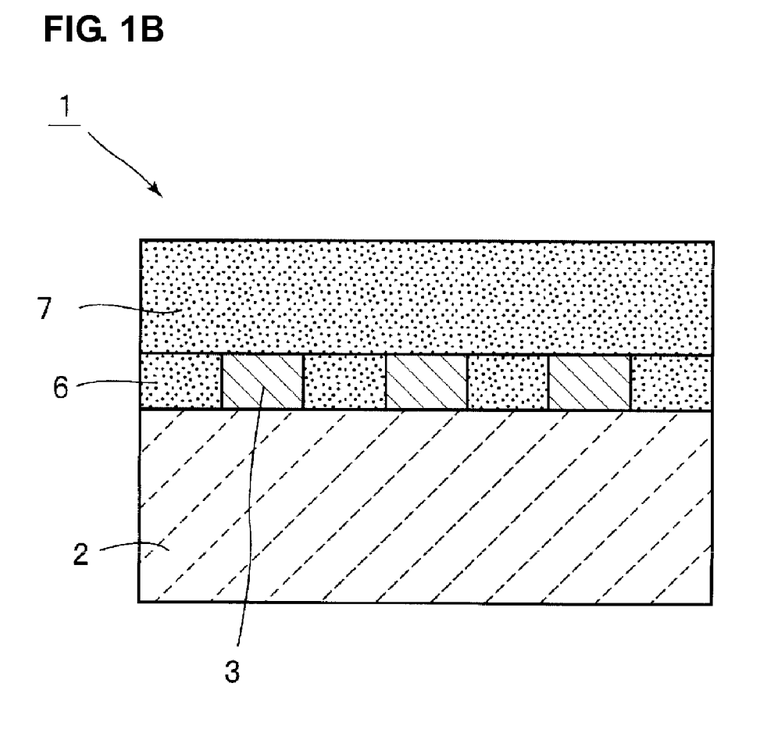

FIG. 1A is a schematic plan view of a surface acoustic wave device according to a preferred embodiment of the present invention, and FIG. 1B is a magnified partial cutaway front sectional view showing a portion thereof.

A surface acoustic wave device 1 includes a rotated Y-cut x-propagation LiNbO₃ substrate 2. The crystal orientation of the LiNbO₃ substrate 2 is specified by Euler angles of (0°±5°, θ, 0°±10°).

Furthermore, as shown in FIG. 1B, an IDT electrode 3 is disposed on the LiNbO₃ substrate 2. As shown in FIG. 1A, reflectors 4 and 5 are disposed on both sides of the IDT electrode 3 in a surface acoustic wave propagation direction.

A first silicon oxide film 6 is disposed in a region other than the region in which the IDT electrode 3 and the reflectors 4 and 5 are disposed. The film thickness of the first silicon oxide film 6 is substantially equal to the film thicknesses of the IDT electrode 3 and the reflectors 4 and 5. Furthermore, a second silicon oxide film 7 is arranged to cover the IDT electrode 3, the reflectors 4 and 5, and the first silicon oxide film 6.

In the surface acoustic wave device 1, the LiNbO₃ substrate has a negative temperature coefficient of resonant frequency. On the other hand, the silicon oxide films 6 and 7 have positive temperature coefficients of resonant frequency. Therefore, the frequency characteristic can be improved.

In addition, the density of the electrode including the IDT electrode 3 is at least about 1.5 times greater than the density of the first silicon oxide film 6. That is, in the present preferred embodiment, the IDT electrode 3 is preferably made of Au. Therefore, the density of the IDT electrode 3 is about 19.3 g/cm³. On the other hand, the density of the first silicon oxide film is about 2.21 g/cm³.

Consequently, as disclosed in WO2005-034347, the reflection coefficient of the IDT electrode 3 can be increased. It is thereby possible to suppress a ripple which occurs in the resonant characteristic.

In the surface acoustic wave device 1 of the present preferred embodiment, the film thickness of the IDT electrode 3 is preferably in the range of about 0.062λ to about 0.14λ, for example, where λ represents the wavelength of a surface acoustic wave, and θ of the Euler angles of (0°±5°, 0±5°, 0°±10°) of the LiNbO₃ substrate 2 is in the range satisfying the following Formula (1). That is, since the film thickness of the IDT electrode 3 is preferably about 0.062λ or more, the electrode resistance can be reduced. Consequently, the loss can be reduced even when higher frequencies are used. Furthermore, since θ of the Euler angle is in a specific range, the electromechanical coefficient of the Rayleigh wave is not significantly reduced.

$$\theta = 31.72 - 206.92 \times \exp(-1 \times T_{Au}/0.0138) \quad \text{Formula (1)}$$

where $T_{Au}$ is a value of Au electrode film thickness normalized with the wavelength λ

This will be described with reference to specific experimental examples.

FIRST EXPERIMENTAL EXAMPLE

Regarding a Rayleigh wave which is excited on the LiNbO₃ substrate 2 represented by the Euler angles of (0°, 20° to 50°, 0°) and the SH wave which causes a spurious response, calculations were performed using a finite element method. As shown in FIG. 1B, in a calculation model, the upper surface of a second silicon oxide film had a substantially flat structure, an IDT electrode was made of Au, and first and second silicon oxide films 6 and 7 were made of SiO₂ films. The duty of the IDT electrode was about 0.50, and the film thickness of the SiO₂ film defining the second silicon oxide film 7 was about 0.3λ.

Figure 2:
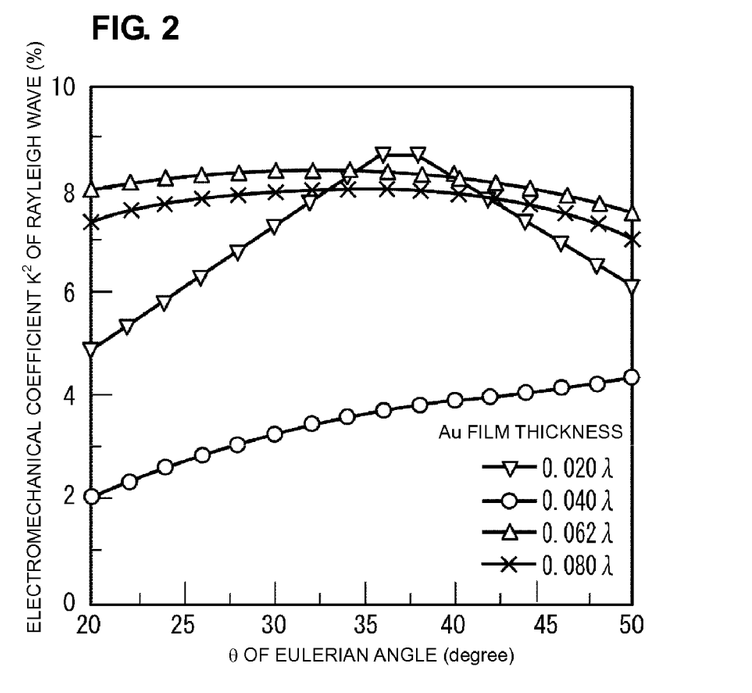
FIG. 2 is a diagram showing changes in electromechanical coefficient $K^2$ of the Rayleigh wave where the thickness of an IDT electrode made of Au and θ of the Euler angle are changed.

Changes in the electromechanical coefficient $K^2$ of the Rayleigh wave where the film thickness of the IDT electrode 3 was specified to be about 0.020λ, about 0.040λ, about 0.062λ, or about 0.080λ and θ of the Euler angle was changed, are shown in FIG. 2. Furthermore, changes in the electromechanical coefficient $K^2$ of the SH wave, which became a spurious response, where the film thickness of the IDT electrode was specified to be about 0.020λ, about 0.040λ, about 0.062λ, or about 0.080λ and θ of the Euler angle was changed, are shown in FIG. 3.

Figure 3:
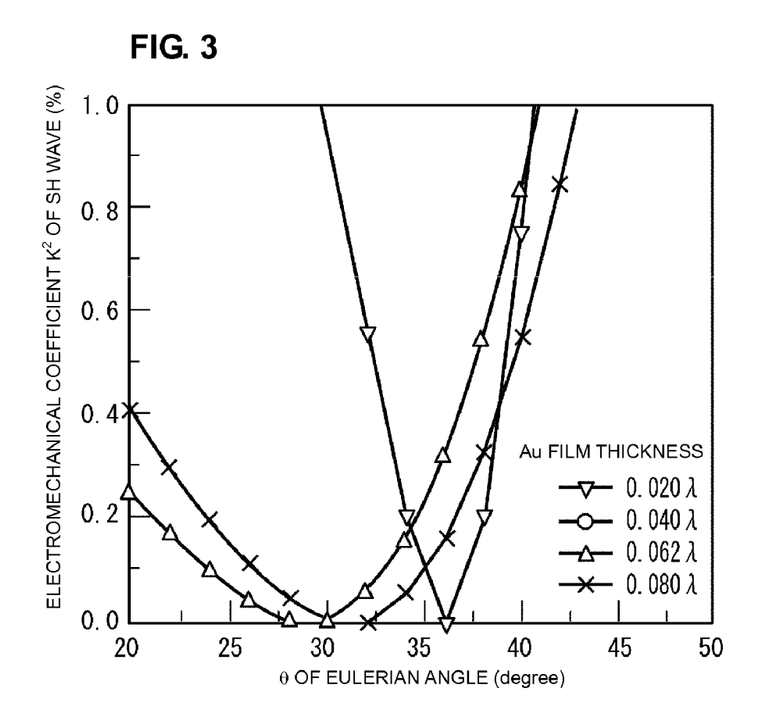
FIG. 3 is a diagram showing changes in electromechanical coefficient $K^2$ of the SH wave where the thickness of an IDT electrode made of Au and θ of the Euler angle are changed.

As shown in FIG. 2 and FIG. 3, where the film thickness of the IDT electrode 3 made of Au is at least about 0.062λ, both of the dependence of the electromechanical coefficient $K^2$ of the Rayleigh wave and the dependence of the electromechanical coefficient $K^2$ of the SH wave on θ of the Euler angle change. That is, regarding the Rayleigh wave, as shown in FIG. 2, where the film thickness of the IDT electrode is about 0.04λ or less, the electromechanical coefficient $K^2$ of the Rayleigh wave is relatively small, and when the film thickness is about 0.02λ or less, the electromechanical coefficient $K^2$ is significantly due to θ of the Euler angle. In contrast, where the film thickness of the IDT electrode is at least about 0.062λ, the electromechanical coefficient $K^2$ of the Rayleigh wave is at least about 6%, and changes due to θ of the Euler angle are greatly reduced.

On the other hand, as shown in FIG. 3, the electromechanical coefficient $K^2$ of the SH wave changes significantly as θ of the Euler angle changes. Where the film thickness of the IDT electrode 3 is about 0.02λ, the electromechanical coefficient $K^2$ of the SH wave, which becomes a spurious response, is a local minimum in the vicinity of θ=36°, whereas where the electrode film thickness is about 0.062λ or about 0.08λ, the electromechanical coefficient of the SH wave is a local minimum in the vicinity of θ=30°. In this manner, where the film thickness of the IDT electrode is about 0.04λ, the electromechanical coefficient of the SH wave was about 5% when θ of the Euler angle was about 36° and, therefore, cannot be shown in FIG. 3.

Consequently, as shown in FIG. 3, θ at which the electromechanical coefficient $K^2$ of the SH wave spurious response is a minimum shifts from the vicinity of θ=36° to the vicinity of 30° where the film thickness of the IDT electrode made of Au is at least about 0.062λ.

Previously, it has been thought that where the Rayleigh wave is used, an SH wave spurious response increases as the film thickness of the IDT electrode 3 increases. That is, as described above, for example, where the electrode film thickness was about 0.04λ and θ of the Euler angle was about 36°, the electromechanical coefficient $K^2$ of the SH wave was about 5%.

On the other hand, where the film thickness is at least about 0.062λ, as shown in FIG. 3, the electromechanical coefficient $K^2$ of the SH wave is about 0.2% to about 0.4% when θ is in the vicinity of 36°, but is reduced to about 0.05% or less in the vicinity of θ=30°.

Figure 4:
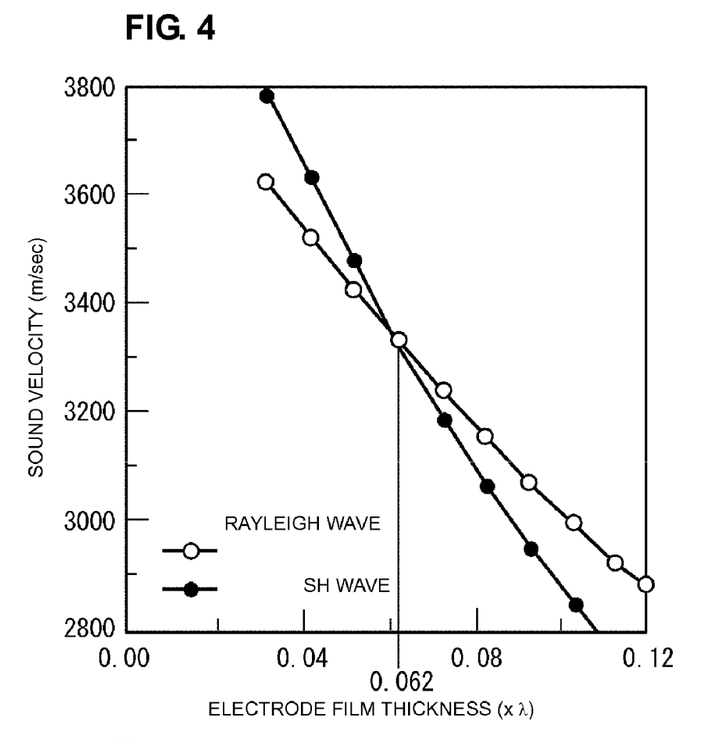
FIG. 4 is a diagram showing changes in sound velocities of the Rayleigh wave and the SH wave where the film thickness of the IDT electrode made of Au is changed.

The reason that the θ dependence of the electromechanical coefficient $K^2$ of the SH wave and the θ dependence of the electromechanical coefficient $K^2$ of the Rayleigh wave change in the vicinity of about 0.06λ in film thickness of the IDT electrode made of Au, as described above, is believed to be that, as shown in FIG. 4, the sound velocity of the Rayleigh wave and the sound velocity of the SH wave intersect at a film thickness of the IDT electrode 3 of about 0.062λ. That is, as shown in FIG. 4, the sound velocities of the SH wave and the Rayleigh wave decrease as the film thickness of the IDT electrode increases, but when the film thickness is at least about 0.062λ, the sound velocity of the Rayleigh wave exceeds the sound velocity of the SH wave.

Therefore, as shown in FIG. 2 and FIG. 3, it is believed that when the film thickness of the IDT electrode is at least about 0.062λ, the sound velocity of the Rayleigh wave and the sound velocity of the SH wave are reversed and, thereby, the θ dependence of the electromechanical coefficient $K^2$ of the Rayleigh wave and the θ dependence of the electromechanical coefficient $K^2$ of the SH wave are changed.

Figure 5:
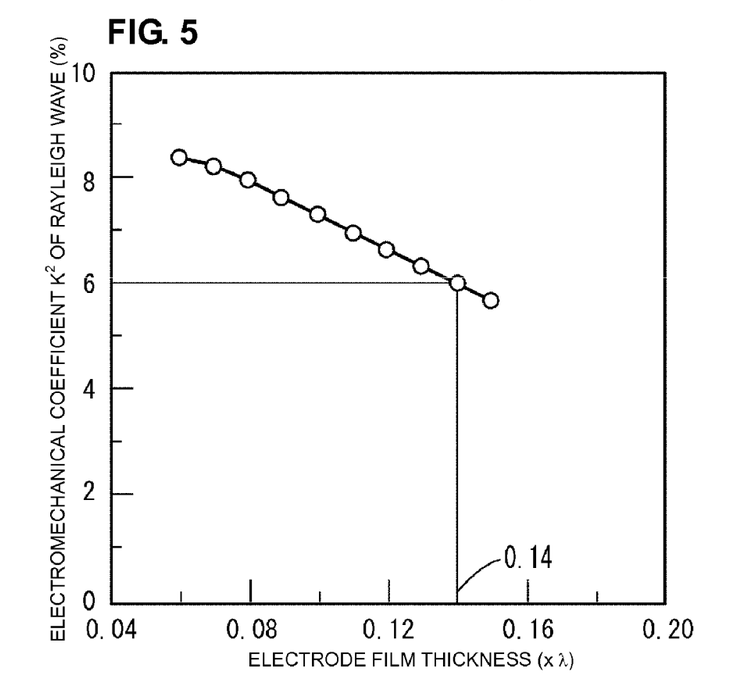
FIG. 5 is a diagram showing changes in electromechanical coefficient of the Rayleigh wave where the film thickness of the IDT electrode is changed.

FIG. 5 is a diagram showing changes in electromechanical coefficient $K^2$ of the Rayleigh wave due to the film thickness of the IDT electrode made of Au. Here, the duty of the IDT electrode 3 was about 0.50, and the film thickness of a SiO₂ film defining the second silicon oxide film 7 was about 0.3λ.

As shown in FIG. 5, the electromechanical coefficient $K^2$ of the Rayleigh wave tends to decrease as the film thickness of the IDT electrode 3 made of Au increases. However, if the film thickness of the IDT electrode 3 is about 0.14λ or less, the electromechanical coefficient $K^2$ of the Rayleigh wave has a satisfactorily high value of at least about 6%. Therefore, the film thickness of the IDT electrode 3 must be about 0.14λ or less in order to enable the electromechanical coefficient $K^2$ to have a satisfactorily high value of at least about 6%.

In preferred embodiments of the present invention, the film thickness of the IDT electrode 3 made of Au is preferably at least about 0.062λ, for example, thereby, the film thickness of the IDT electrode is satisfactorily increased, and the electrode resistance is reduced. In this case, on the basis of the results shown in FIG. 2 and FIG. 3, a spurious response due to the SH wave can be satisfactorily reduced and, in addition, the electromechanical coefficient $K^2$ of the Rayleigh wave has a satisfactorily high value of at least about 6% by selecting θ of the Euler angle, as described later. In particular, the electromechanical coefficient $K^2$ of the Rayleigh wave can be reliably increased to at least about 6% by setting the film thickness of the IDT electrode to be about 0.14λ or less, as described above.

Figure 6:
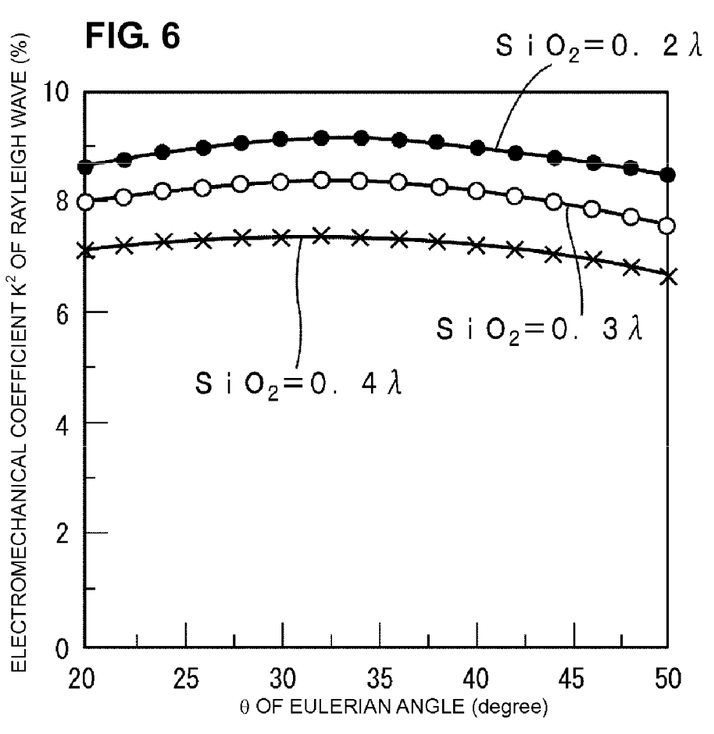
FIG. 6 is a diagram showing changes in electromechanical coefficient $K^2$ of the Rayleigh wave due to changes in θ of the Euler angle where the film thickness of the second silicon oxide film is specified to be about 0.2λ, about 0.3λ, or about 0.4λ.

FIG. 6 is a diagram showing changes in electromechanical coefficient $K^2$ of the Rayleigh wave due to θ of the Euler angle where the duty of the IDT electrode was about 0.50, the film thickness of the IDT electrode 3 made of Au was about 0.062λ, and the film thickness of a SiO₂ film defining the second silicon oxide film 7 was about 0.2λ, about 0.3λ, or about 0.4λ.

Figure 7:
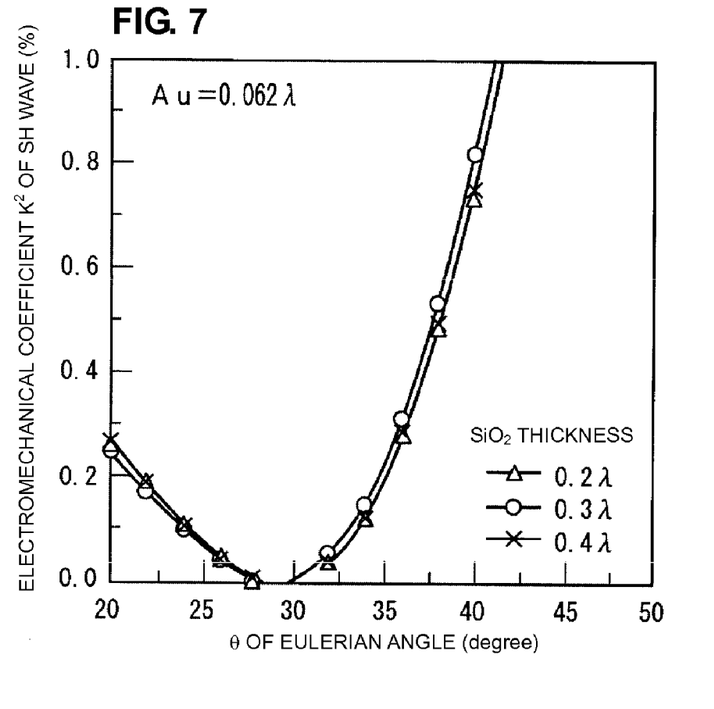
FIG. 7 is a diagram showing changes in electromechanical coefficient $K^2$ of the SH wave due to changes in θ of the Euler angle where the film thickness of the second silicon oxide film is specified to be about 0.2λ, about 0.3λ, or about 0.4λ.

Similar to FIG. 6, FIG. 7 is a diagram showing changes in electromechanical coefficient $K^2$ of the SH wave due to θ of the Euler angle where the film thickness of the IDT electrode 3 made of Au was about 0.062λ, the duty was about 0.50, and the film thickness of the second silicon oxide film was about 0.20λ, about 0.3λ, or about 0.4λ.

As shown in FIG. 6, in every case in which the film thickness of the second silicon oxide film is about 0.2λ, about 0.3λ, or about 0.4λ, even when the θ of the Euler angle is changed, the electromechanical coefficient $K^2$ of the Rayleigh wave does not significantly change and a high value of at least about 6%. On the other hand, as shown in FIG. 7, the electromechanical coefficient $K^2$ of the SH wave changes significantly as θ of the Euler angle changes, and almost the same result is obtained in every case in which the film thickness of the second silicon oxide film is about 0.2λ, about 0.3λ, or about 0.4λ.

Consequently, as shown in FIG. 6 and FIG. 7, even when the film thickness of the second silicon oxide film 7 is varied because of variations in production and other factors, the dependence of the Rayleigh wave and the dependence of the SH wave on θ of the Euler angle does not significantly change. Therefore, according to the above-described preferred embodiment, the surface acoustic wave device 1 exhibiting stable characteristics can be provided, wherein variations in influence on the characteristics caused by an SH wave spurious response do not significantly occur even when variations occur in thickness of the second silicon oxide film 7 made of a SiO₂ film.

Figure 8:
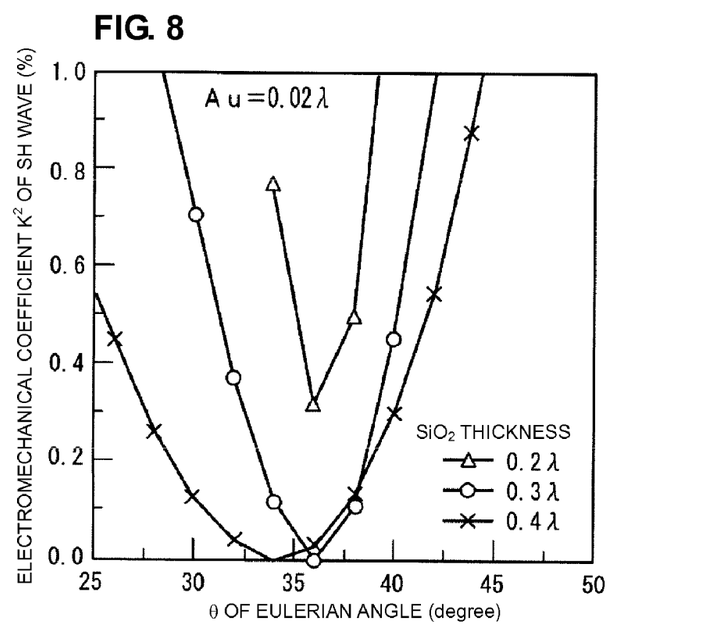
FIG. 8 is a diagram showing changes in electromechanical coefficient $K^2$ of the SH wave due to changes in θ of the Euler angle where the film thickness of the IDT electrode made of Au is about 0.02λ and where the film thickness of the second silicon oxide film is about 0.2λ, about 0.3λ, or about 0.4λ.

Incidentally, FIG. 8 is a diagram showing changes in electromechanical coefficient K² of the SH wave due to changes in θ of the Euler angle and the film thickness of the second silicon oxide film 7 where the film thickness of the IDT electrode 3 is about 0.02λ. As shown FIG. 8, where the film thickness of the IDT electrode 3 made of Au is about 0.02λ, changes in electromechanical coefficient K² of the SH wave due to θ of the Euler angle are very different between the case in which the film thickness of the second silicon oxide film 7 is about 0.2λ, the case in which the film thickness is about 0.3λ, and the case in which the film thickness is about 0.4λ. Consequently, it is clear that where the film thickness of the IDT electrode 3 is a about 0.02λ, if the film thickness of the second silicon oxide film 7 varies, the characteristics vary significantly.

Since the SH wave is a spurious response, it is preferable that the electromechanical coefficient K² thereof is small. The value of θ at which the electromechanical coefficient K² of the SH wave becomes a minimum is represented by the following Formula (1), where $T_{Au}$ represents the film thickness of the IDT electrode 3 made of Au. This Formula (1) was derived from the results shown in FIG. 3.

$$\theta = 31.72 - 206.92 \times \exp(-1 \times T_{Au}/0.0138) \quad \text{Formula (1)}$$

where $T_{Au}$ is a value of Au electrode film thickness normalized with the wavelength λ

Furthermore, if the electromechanical coefficient K² of the SH wave is about 0.1% or less, very little influence is caused by the spurious response. Consequently, it is desirable that θ represented by the above-described Formula (1) is in the range of about θ±5°. In that case, the electromechanical coefficient K² of the SH wave is about 0.1% or less.

Furthermore, as shown in FIG. 6, if the film thickness of the second silicon oxide film made of SiO₂ is in the range of about 0.2λ to about 0.4λ, the electromechanical coefficient K² of the Rayleigh wave is at least about 6% over a wide range of θ of the Euler angle of about 20° to about 50°. According to the experiments conducted by the present inventors, it was determined that if the film thickness of the second silicon oxide film was in the range of about 0.15λ to about 0.5λ, the electromechanical coefficient K² of the Rayleigh wave was at least about 6%. Therefore, the film thickness of the second silicon oxide film is preferably in the range of about 0.15λ to about 0.5λ, for example, and more preferably in the range of about 0.2λ to about 0.4λ, for example, as shown in FIG. 6.

Figure 9:
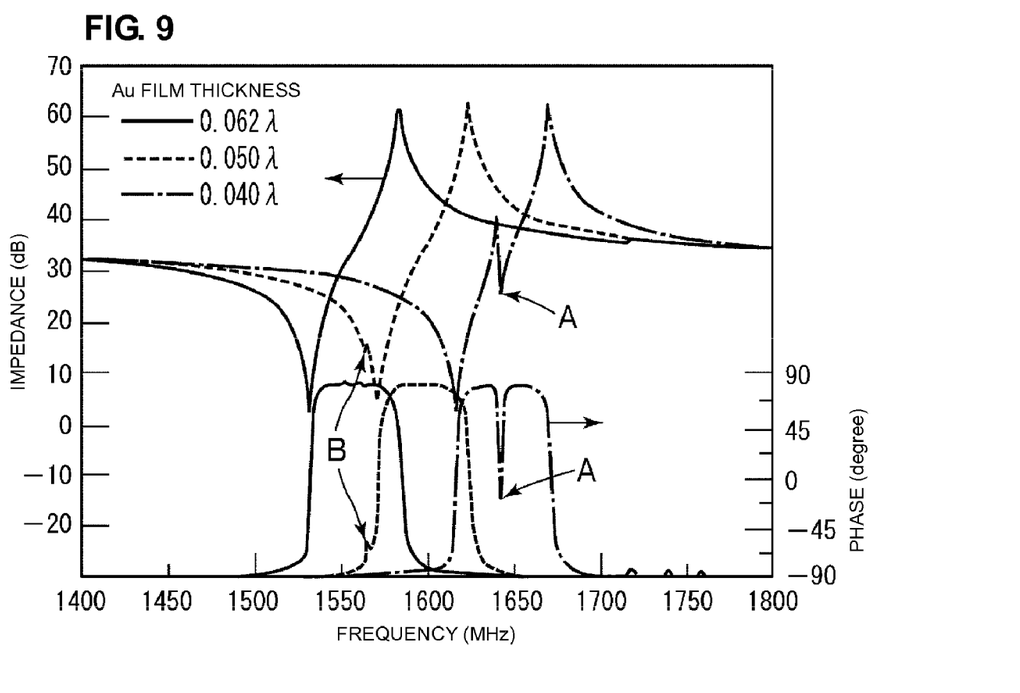
FIG. 9 is a diagram showing the impedance characteristic and the phase characteristic of surface acoustic wave devices of a preferred embodiment and first and second comparative examples.

FIG. 9 shows the impedance characteristics and the phase characteristics of the surface acoustic wave device 1 of the above-described preferred embodiment and surface acoustic wave devices of first and second comparative examples prepared for the purpose of comparison. In the surface acoustic wave device of the preferred embodiment, the IDT electrode 3 was an Au film having a film thickness of about 0.05λ. In the first comparative example, the film thickness of the Au film was specified to be about 0.05λ, and in the second comparative example, the film thickness of the Au film was specified to be about 0.04λ.

Here, the specifications other than the film thickness of the IDT electrode 3 were as described below.

Regarding the surface acoustic wave device of the above-described preferred embodiment, an IDT electrode 3 having a thickness of about 0.062λ=about 126 nm was disposed on a LiNbO₃ substrate 2 represented by Euler angles of (0°, 30°, 0°), and a SiO₂ film of about 600 nm=about 0.29λ was provided a second silicon oxide film 7, so that a 1.9-GHz-band surface acoustic wave resonator of one-port type was prepared. Here, λ=about 2.07 μm was used.

Regarding the first comparative example, an IDT electrode was made of a Au film having a thickness of about 104 nm=about 0.05λ, and the film thickness of the second silicon oxide film 7 was specified to be about 600 nm=about 0.29λ. Regarding the second comparative example, the thickness of an IDT electrode made of Au was about 83 nm=about 0.04λ, and the film thickness of a SiO₂ film defining a second silicon oxide film was about 600 nm=about 0.29λ. The duty of each of the IDT electrodes was about 0.5.

A solid line indicates the results of the above-described preferred embodiment, a broken line indicates the results of the first comparative example, and an alternate long and short dash line indicates the results of the second comparative example.

As shown in FIG. 9, in the second comparative example, a large spurious response indicated by an arrow A occurs between a resonant frequency and an anti-resonant frequency, and in the first comparative example, a spurious response indicated by an arrow B occurs on the lower range side of a resonant frequency. These spurious responses are believed to be spurious responses caused by the SH wave. On the other hand, in the surface acoustic wave device 1 of the above-described preferred embodiment, such a spurious response is not observed.

Figure 10:
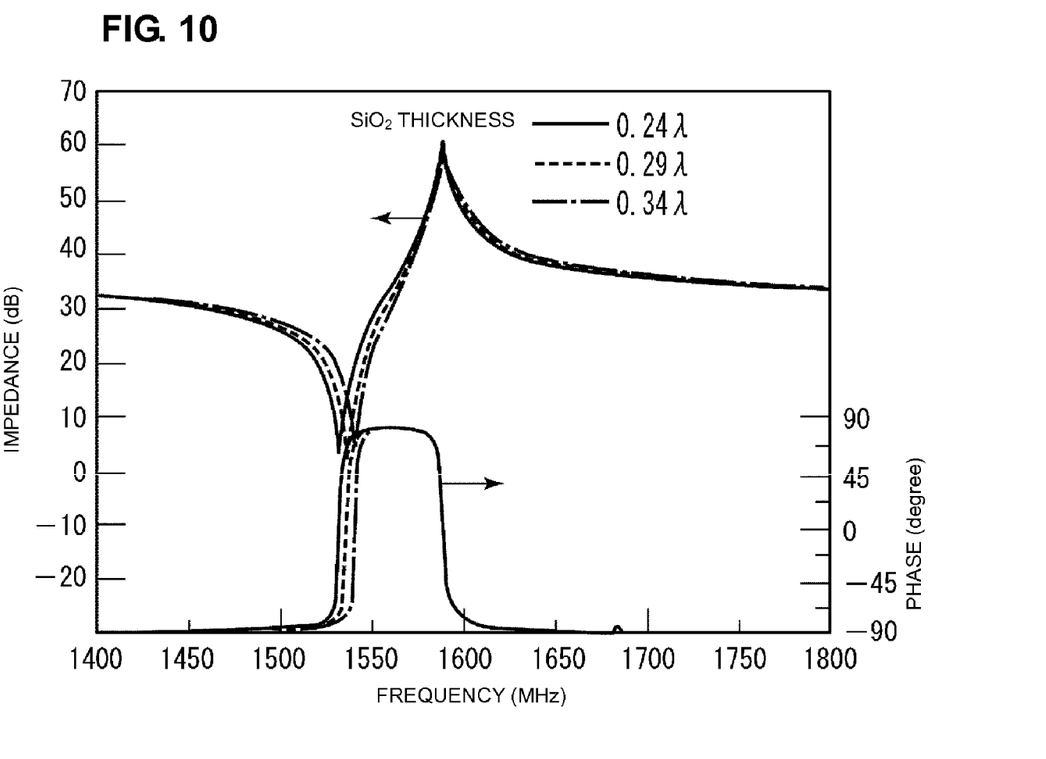
FIG. 10 is a diagram showing the impedance characteristic and the phase characteristic of a surface acoustic wave device of a preferred embodiment where the film thickness of the second silicon oxide film is specified to be about 0.34λ, about 0.29λ, or about 0.24λ.

Surface acoustic wave devices were produced that were similar to the surface acoustic wave device according to the above-described embodiment except that the film thickness of the second silicon oxide film 7 in the surface acoustic wave device 1 was changed from about 0.34λ to about 0.29λ and about 0.24λ. FIG. 10 shows the measurement results of filter characteristics of these surface acoustic wave devices. As in the above-described preferred embodiment, a solid line indicates the results where the film thickness of the second silicon oxide film is about 0.34λ, a broken line indicates the results where the film thickness is about 0.29λ, and an alternate long and short dash line indicates the results where the film thickness is about 0.24λ.

As shown in FIG. 10, a spurious response is not observed in any of the surface acoustic wave devices and, therefore, a good resonant characteristic is obtained. Consequently, even when the film thickness of the second silicon oxide film composed of SiO₂ varies, a spurious does not appear easily, so that a good resonant characteristic can be obtained stably.

In the above-described preferred embodiment, the Euler angles of the LiNbO₃ substrate are preferably (0°, 0±5°, 0°). Regarding the Euler angles of (Φ, θ, φ), it is sufficient that Φ is in the range of about 0°±5° and φ is in the range of about 0°±10°, and in each case, similar results as the results of the above-described preferred embodiment are obtained.

In the above-described preferred embodiment, the IDT electrode is preferably made of Au. However, an electrode primarily including Au may used. An adhesion layer having a relatively small thickness may be disposed under a main electrode layer made of Au, or a thin protective electrode layer may be laminated on an electrode primarily including Au. In these cases, it is sufficient that the thickness of the main electrode layer made of Au is substantially equal to the thickness of the electrode of the preferred embodiment of the present invention.

Furthermore, preferred embodiments of the present invention can be applied to not only the above-described one-port surface acoustic wave resonators and band pass filter portions of duplexers, but also to various resonators and surface acoustic wave filters having various circuit configurations.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A surface acoustic wave device utilizing a Rayleigh wave, the device comprising:
   a LiNbO$_3$ substrate having Euler angles of (0°±5°, θ±5°, 0±10°);
   an electrode disposed on the LiNbO$_3$ substrate and including an IDT electrode primarily including Au;
   a first silicon oxide film disposed in a region other than a region in which the electrode is disposed, the first silicon oxide film having a film thickness substantially equal to a thickness of the electrode; and
   a second silicon oxide film arranged to cover the electrode and the first silicon oxide film; wherein
   the film thickness of the electrode is in the range of about 0.062λ to about 0.14λ, where λ represents the wavelength of a surface acoustic wave, and θ of the Euler angles of (0°±5°, θ±5°, 0°±10°) is in a range satisfying the following Formula:

$$\theta = 31.72 - 206.92 \times \exp(-1 \times T_{Au}/0.0138)$$

where $T_{Au}$ is a value of Au electrode film thickness normalized with the wavelength λ.

2. The surface acoustic wave device according to claim 1, wherein the film thickness H of the second silicon oxide film is in a range of about 0.15λ to about 0.50λ.

3. The surface acoustic wave device according to claim 1, wherein the film thickness H of the second silicon oxide film is in a range of about 0.2λ to about 0.4λ.

* * * * *